US006961742B2

(12) United States Patent
Neretti et al.

(10) Patent No.: US 6,961,742 B2
(45) **Date of Patent: *Nov. 1, 2005**

(54) SIGNAL ADAPTIVE FILTER BANK OPTIMIZATION

(75) Inventors: Nicola Neretti, Providence, RI (US); Nathan Intrator, Providence, RI (US)

(73) Assignee: Brown University Research Foundation, Providence, RI (US)

(*) Notice: Subject to any disclaimer, the term of this patent is extended or adjusted under 35 U.S.C. 154(b) by 718 days.

This patent is subject to a terminal disclaimer.

(21) Appl. No.: 10/076,059

(22) Filed: Feb. 14, 2002

(65) Prior Publication Data

US 2003/0005007 A1 Jan. 2, 2003

Related U.S. Application Data

(60) Provisional application No. 60/269,678, filed on Feb. 20, 2001.

(51) Int. Cl.[7] ................................................ G06F 17/10
(52) U.S. Cl. ........................................ 708/300; 708/400
(58) Field of Search ................................ 708/300, 321, 708/400; 382/260

(56) References Cited

U.S. PATENT DOCUMENTS 5,384,725 A 1/1995 Coifman et al.
5,526,299 A 6/1996 Coifman et al.
6,101,284 A * 8/2000 Matsubara et al. ......... 382/260
6,581,081 B1 * 6/2003 Messerly et al. ........... 708/322
6,684,234 B1 * 1/2004 Kraker ....................... 708/322

* cited by examiner

*Primary Examiner*—Chuong Dinh Ngo
(74) *Attorney, Agent, or Firm*—Weingarten, Schurgin, Gagnebin & Lebovici LLP

(57) ABSTRACT

A method for finding optimal filter coefficients for a filter given an input data sequence and an objective function is disclosed. The method includes selecting a wavelet basis having k parameters and minimizes the k parameters according to the predetermined objective function. The wavelet basis is reparameterized into k/2 rotation parameters and factorized into a product of rotation and delay matrices. The k/2 rotation parameters are provided for the rotation matrices and a data transform matrix is computed based on the product of the rotation and delay matrices. The input data sequence is converted into transformed data by applying the data transform matrix to the input data. The Jacobian of the data transform matrix and the input data sequence is determined and multiplied by the gradient vector with respect to the transformed data of the objective function. This product is compared to a predetermined criterium and if the predetermined criterium is not satisfied, a new set of k/2 parameter values are provided and the gradient descent is continued until the optimal k/2 parameters are found. The optimal filter coefficients are then calculated based on the optimal k/2 parameters. The wavelet basis may be selected from a wavelet packet library containing orthonormal wavelet packet bases, and in which the selected wavelet packet basis is minimized according to a cost function, which can be an entropy function.

21 Claims, 5 Drawing Sheets

SIGNAL ADAPTIVE FILTER BANK OPTIMIZATION

CROSS REFERENCE TO RELATED APPLICATIONS

This application claims priority under 35 U.S.C. §19(e) to U.S. Provisional Patent Application Ser. No. 60/269,678, filed Feb. 20, 2001 the disclosure of which is incorporated by reference.

STATEMENT REGARDING FEDERALLY SPONSORED RESEARCH OR DEVELOPMENT

BACKGROUND OF THE INVENTION

Filter coefficients can be optimized according to many different criterium. For example stop band attenuation, coding gain, degree of smoothness can be used as the criterium to optimize a filter. However, solving for these optimal filter coefficients requires solving a time domain problem that is a non-linear constrained optimization problem that can be difficult to solve. In order to optimize these coefficients requires solving the non-linear constrained optimization equations iteratively to arrive at the optimum solutions. However, this iterative process is computationally expensive due to the difficulty of solving the equations. In addition, if the constraints are not satisfied then the solution is not invertible.

Therefore, it would be advantageous to provide a method for solving for the optimal parameters for a filter that is not constrained and is more efficient computationally than the time domain problem.

BRIEF SUMMARY OF THE INVENTION

A method for finding optimal filter coefficients for a filter given an input data sequence and an objective function is disclosed. The method includes selecting a wavelet basis having k parameters and minimizing the predetermined objective function with respect to the k parameters. The wavelet basis is reparameterized into k/2 rotation parameters and factorized into a product of rotation and delay matrices. The k/2 rotation parameters are provided for the rotation matrices and a data transform matrix is computed based on the product of the rotation and delay matrices. The input data sequence is converted into transformed data by applying the data transform matrix to the input data. The Jacobian of the data transform matrix and the input data sequence is determined and multiplied by the gradient vector with respect to the transformed data of the objective function. This product is compared to a predetermined criterium and if the predetermined criterium is not satisfied, a new set of k/2 parameter values are provided and the gradient descent is continued until the optimal k/2 parameters are found. The optimal filter coefficients are then calculated based on the optimal k/2 parameters. The wavelet basis may be selected from a wavelet packet library containing orthonormal wavelet packet bases, and in which the selected wavelet packet basis minimizes a given cost function, which can be an entropy function.

A method for determining filter coefficients to form a filter to filter data of length N is disclosed, wherein the filter coefficients are optimized to minimize an objective function that measures a predetermined quality of the signal data. The method includes the steps of providing the number of coefficients, k, in the filter and selecting a wavelet packet basis. An objective function is provided and the first set of k/2 parameter values are also provided. A data transform matrix is formed as a function of the selected wavelet packet basis and the k/2 parameter values. The data is transformed by multiplying the data transform matrix with the data, and the value of the objective function is calculated using the transformed data. The optimal set of values for the k/2 parameters are then found based on the value of the objective function.

In one embodiment, finding the optimal set of values for the k/2 parameters includes first determining if the objective function satisfies a first criteria. If the first criteria is satisfied, the optimal filter coefficients are calculated using the current set of k/2 parameters. If the objective function does not satisfy the first criteria a gradient steepest descent method is used to modify the k/2 parameters to a local minimum of the objective function. The gradient steepest descent method is one in which the Jacobian of the data transform matrix is calculated and multiplied by the gradient of the value of the objective function with respect to the transformed data. If the product of the Jacobian and the gradient satisfies a predetermined criterium, the iterative process is stopped and the optimal filter coefficients are calculated based on the current set of k/2 parameters. If the product of the Jacobian and the gradient does not satisfy the predetermined criterium the values of the k/2 parameters are updated based on the value of the gradient, and the process is continued in an iterative manner until the criterium is satisfied and the optimal parameters found.

Other forms, features and aspects of the above-described methods and system are described in the detailed description that follows.

BRIEF DESCRIPTION OF THE SEVERAL VIEWS OF THE DRAWING

The invention will be more fully understood by reference to the following Detailed Description of the Invention in conjunction with the Drawing of which.

DETAILED DESCRIPTION OF THE INVENTION

A method for determining the optimal filter coefficients to form a filter of length M for filtering data of length N is disclosed. The filter is optimized to achieve an optimal value for an objective function that measures a predetermined quality of the signal data.

Figure 1A:
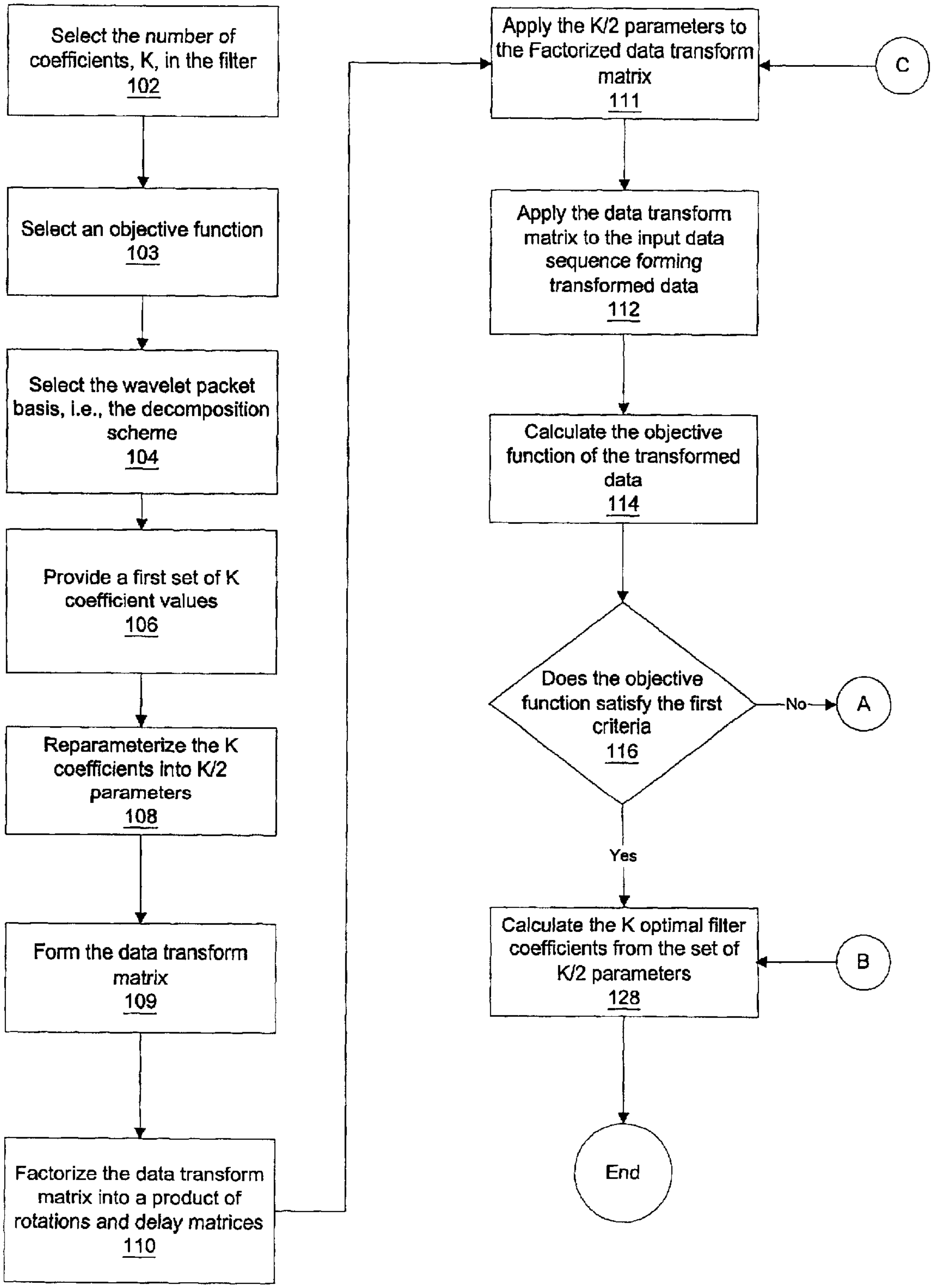
FIGS. 1A and 1B together form a flowchart depicting one method of determining optimal filter parameters according to the presently disclosed invention.
Figure 1B:
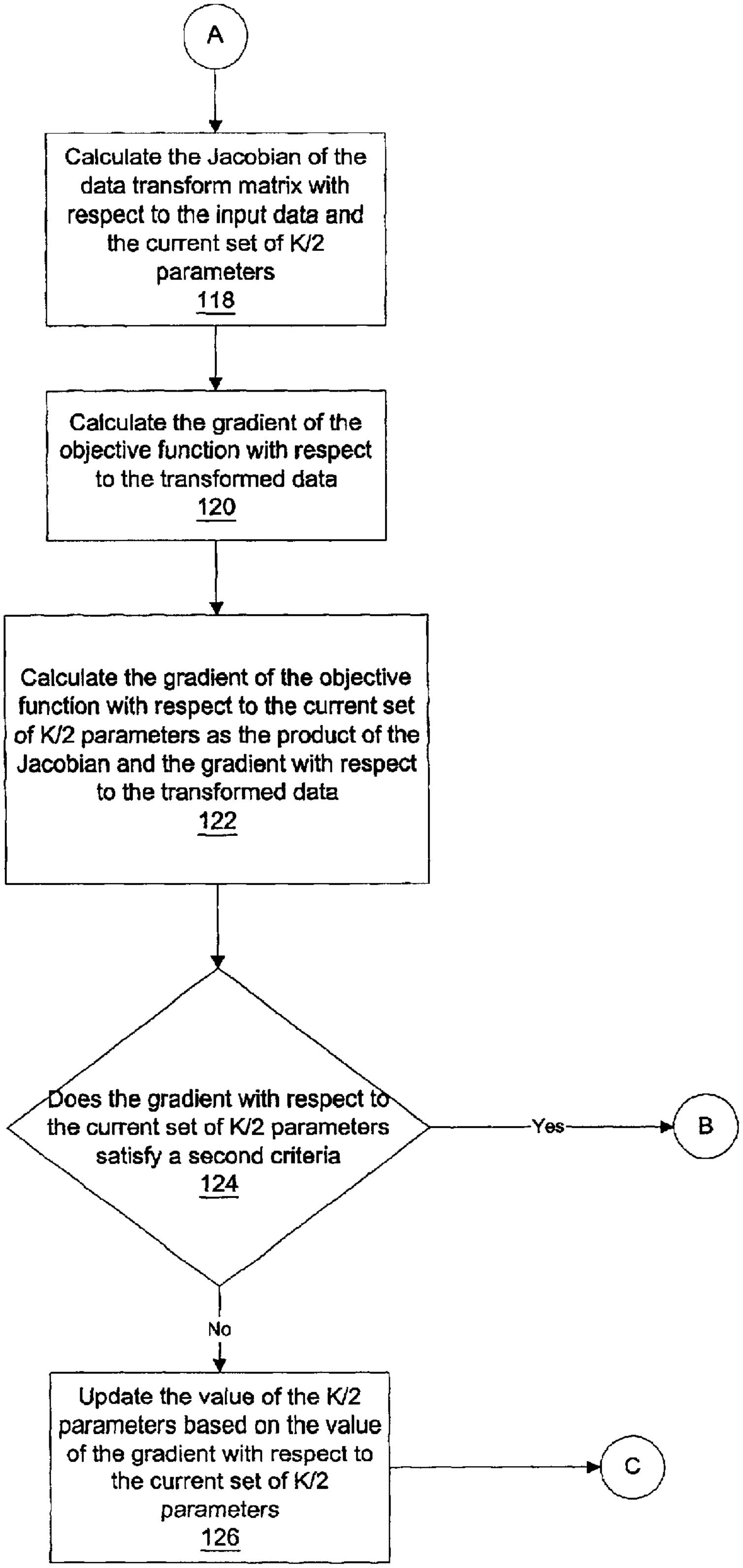

FIG. 1 depicts a flow chart for determining the optimal filter coefficients, wherein the number of filter coefficients, K, is selected, as depicted in step 102. The value of K can be selected based on the filter requirements, the system requirements, or a priori knowledge of the system response, or a combination of one or more these criterium. An objective function is provided, as depicted in step 103. The wavelet packet basis, i.e., the decomposition scheme is selected, as depicted in step 104, and a set of K coefficients are selected forming a predetermined mother wavelet, as depicted in step 106. The K coefficients are reparameterized into k/2 parameters that correspond to the mother wavelet in the lattice decomposition, as depicted in step 108. The data transform matrix is formed using the decomposition scheme and the reparameterized k/2 parameters, as depicted in step 109. The data transform matrix is factorized into a product of rotation and delay matrices, as depicted in step 110. The k/2 parameters are applied to the rotation matrices and used to provide the numerical values of the data transform matrix, as depicted in step 111. The data transform matrix is applied to a data sequence producing transformed data, as depicted in step 112. The objective function of the transformed data is calculated, as depicted in step 114, and compared to a first criteria, as depicted in step 116. In the event that the calculated objective function satisfies the first criteria, control passes to step 128 and the optimal filter coefficients are calculated using the optimal parameters. In the event that the first criteria is not satisfied control passes to step 118. If the algorithm does not converge, a control loop can be used to limit the number of iterations and a new set of k/2 parameters can be provided and the process restarted.

In step 118, The Jacobian of the factorized-reparameterized second filter basis is calculated. The gradient of the objective function of the transformed data with respect to the transformed data is calculated, as depicted in step 120. The Jacobian and the gradient are then multiplied together to form the gradient of the objective function with respect to the set of k/2 parameters, as depicted in step 122. The gradient of the objective function with respect to the set of k/2 parameters is compared to a second criteria, as depicted in step 124. In the event that the gradient satisfies the second criteria, control passes to step 128 and the optimal filter coefficients are calculated from the first set of filter parameters. In the event that the gradient does not satisfy the criterium, control passes to step 126. In step 126 the value of the k/2 parameters are updated as a function of the value of the gradient value and control passes to step 111, wherein the intervening steps are repeated with the new set of filter parameters. This process is continued until either the objective function satisfies the first criteria or the gradient satisfies the second criteria.

Alternatively, the initial values of the k/2 parameters can be determined other than by the time domain methods described above. For example, after executing steps 102, 103, and 104, the values of the k/2 parameters can be determined using other techniques. In one embodiment, the values of the k/2 parameters can be determined randomly and used in the optimization process. Alternatively, a user having a priori information or experience can select the values of the k/2 parameters accordingly. Alternatively, step 106 can also be executed and a mother wavelet selected and a set of a priori values for the k/2 parameters can be supplied. In all of these alternative embodiments the optimization of the parameters can continue as described above with respect to steps 111-126. Step 128 is executed in the case where a digital filter architecture is used. In the case where the optimization and filtering is to be accomplished using lattice filters, there is no need to execute step 128 to find the coefficients of the digital filters.

Filters can be optimized according to different criterium. The different criterium can be described according to a predetermined objective function. For example, stop-band attenuation, coding gain, and degree of smoothness are three possible criterium. Alternatively, the predetermined objective function can be based on morphological aspects of the signal to be filtered. For instance in medical monitoring applications, an objective function may be used to differentiate between normal breathing patterns and labored or wheezing breathing patterns, or between a normal cardiac rhythm and an abnormal cardiac rhythm. The objective function is application specific and developed according to a set of promulgated system requirements.

In general, a discrete wavelet transform includes low-pass and high-pass filters applied to a signal and the output is down-sampled by a factor of two. The high-pass coefficients are retained and the high-pass and low-pass filters are applied to the low-pass coefficients until the length of the residual signal is smaller than the length of the filter. Accordingly, in general the maximum number of times a filter of length M+1, followed or preceded by a decimation by a factor of 2, can be applied to a data signal of length N+1, where N+1 is a power of two, is given by:

$$Q_{\max} = \text{floor}\left[\log_2\left(\frac{N+1}{M+1}\right)\right]. \tag{1}$$

It should be noted that the data signal does not have to be a power of two for the optimal filter coefficients to be found. Although, the algorithm will operate more efficiently and faster for signal lengths that are a power of two it is not required. If the signal length is not a power of two, any of the well known techniques to extend the data set may be used. For example, zero padding where zeros are added to the end of the data signal to increase the signal length without interfering with the spectral analysis is an option as is the use of boundary wavelets to analyze the edges of the data signal. Other techniques that are known in signal processing may be used depending on the system requirements, the length of the data stream to be analyzed and other design requirements.

Consider a discrete wavelet transform operating on a signal with length that is a power of 2. As an illustration a filter of length 4 is operating on a signal of length 8. Let $\vec{x}=[x(\mathbf{0}),x(\mathbf{1}),\ldots x(\mathbf{7})]^T$ be the original signal and c(0), c(1), c(2), and c(3) and d(0), d(1), d(2), d(3) be the low pass and high pass filter coefficients respectively. After applying the two filters to the original data, the result is down-sampled by two:

$$[\sigma(\mathbf{0}), \sigma(\mathbf{1}), \sigma(\mathbf{2}), \sigma(\mathbf{3}), \delta(\mathbf{0}), \delta(\mathbf{1}), \delta(\mathbf{2}), \delta(\mathbf{3})]^T = C_1\vec{x}, \tag{2}$$

where $$C_1 = \begin{bmatrix} c(3) & c(2) & c(1) & c(0) & 0 & 0 & 0 & 0 \\ 0 & 0 & c(3) & c(2) & c(1) & c(0) & 0 & 0 \\ 0 & 0 & 0 & 0 & c(3) & c(2) & c(1) & c(0) \\ c(1) & c(0) & 0 & 0 & 0 & 0 & c(3) & c(2) \\ d(3) & d(2) & d(1) & d(0) & 0 & 0 & 0 & 0 \\ 0 & 0 & d(3) & d(2) & d(1) & d(0) & 0 & 0 \\ 0 & 0 & 0 & 0 & d(3) & d(2) & d(1) & d(0) \\ d(1) & d(0) & 0 & 0 & 0 & 0 & d(3) & d(2) \end{bmatrix}. \tag{3}$$

The process is repeated on the just the σ's, the low pass coefficients:

$$C_2[\sigma(\mathbf{0}), \sigma(\mathbf{1}), \sigma(\mathbf{2}), \sigma(\mathbf{3}), \delta(\mathbf{0}), \delta(\mathbf{1}), \delta(\mathbf{2}), \delta(\mathbf{3})]^T, \tag{4}$$

where $$C_2 = \begin{bmatrix} c(3) & c(2) & c(1) & c(0) & 0 & 0 & 0 & 0 \\ c(2) & c(0) & c(3) & c(1) & 0 & 0 & 0 & 0 \\ d(3) & d(2) & d(1) & d(0) & 0 & 0 & 0 & 0 \\ d(1) & d(0) & d(3) & d(2) & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}. \quad (5)$$

These two steps can be combined and the transformed signal $\vec{y}$ is given by:

$$\vec{y} = C\vec{x} = C_2 C_1 \vec{x}. \quad (6)$$

If $C_1$ is orthonormal, then $C_2$ and C are also orthonormal. The conditions for orthonormality are given by:

$$c(\mathbf{0})^2+c(\mathbf{1})^2+c(\mathbf{2})^2+c(\mathbf{3})^2=1 \quad (7)$$

$$c(\mathbf{0})c(\mathbf{2})+c(\mathbf{1})c(\mathbf{3})=0 \quad (7)$$

$$d(\mathbf{0})^2+d(\mathbf{1})^2+d(\mathbf{2})^2+d(\mathbf{3})^2=1 \quad (8)$$

$$d(\mathbf{0})d(\mathbf{2})+d(\mathbf{1})d(\mathbf{3})=0 \quad (8)$$

$$c(\mathbf{0})d(\mathbf{0})+c(\mathbf{1})d(\mathbf{1})+c(\mathbf{2})d(\mathbf{2})+c(\mathbf{3})d(3)=0$$

$$c(\mathbf{0})d(\mathbf{2})+c(\mathbf{1})d(\mathbf{3})=0 \quad (9)$$

$$c(\mathbf{2})d(\mathbf{0})+c(\mathbf{3})d(\mathbf{1})=0 \quad (9)$$

If the c's satisfy (7), then equations (8) and (9) can be solved using:

$$d(k)=(-1)^k c(3-k),\ k=0, \ldots, 3. \quad (10)$$

As discussed above, the number of times filters of length M+1 can be applied to a signal of length N+1, where N+1 is a power of two, is given by equation (1). Accordingly, the matrix C can be the product of Q orthonormal matrices:

$$C=C_Q C_{Q-1} \ldots C_2 C_1, \quad (11)$$

where $Q \leqq Q_{max}$ and $Q_{max}$ is given in equation (1).

The above example is intended for illustrative purposes only. In general, the constraints on the c's are given by:

$$\sum_{n=2k}^{N} c(n)c(n-2k) = \delta(k),\ k = 0, \ldots, (N-1)/2, \quad (12)$$

the constraints on the d's are given by $$\sum_{n=2k}^{N} d(n)d(n-2k) = \delta(k),\ k = 0, \ldots, (N-1)/2, \quad (13)$$

and the relations between the c's and the d's are given by:

$$\sum_{n=2k}^{N} c(n)d(n-2k) = \delta(k),\ k = 0, \ldots, (N-1)/2 \quad (14)$$

-continued $$\sum_{n=2k}^{N} c(n-2k)d(n) = \delta(k),\ k = 0, \ldots, (N-1)/2$$

and where δ(k) is the Kronecker delta function. As above, when equation (12) is satisfied, equations (13) and (14) may be solved using:

$$d(k)=(-1)^k c(N-k),\ k=0, \ldots, N. \quad (15)$$

This leads to a constrained optimization problem that is difficult to solve for some applications. The coefficients c(0), c(1), . . . c(N) are reparameterized so that the constraints in equation (12) are automatically satisfied. For example, equation (7) implies that:

$$[c(\mathbf{0})+c(\mathbf{2})]^2+[c(\mathbf{1})+c(\mathbf{3})]^2=1, \quad (16)$$

which is automatically satisfied by setting $$c(\mathbf{0})+c(\mathbf{2})=\cos(\theta_1+\theta_2)$$

$$c(\mathbf{1})+c(\mathbf{3})=\sin(\theta_1+\theta_2). \quad (17)$$

Where the number of parameters have been reduced by one-half, from four to two in the illustrative example. Using the trigonometric formulas $$\cos(\alpha+\beta)=\cos(\alpha)\cos(\beta)-\sin(\alpha)\sin(\beta)$$

$$\sin(\alpha+\beta)=\sin(\alpha)\cos(\beta)+\cos(\alpha)\sin(\beta), \quad (18)$$

leads to solving for the c's using:

$$c(\mathbf{0})=\cos(\theta_1)\cos(\theta_2)$$

$$c(\mathbf{1})=\cos(\theta_1)\sin(\theta_2)$$

$$c(\mathbf{2})=-\sin(\theta_1)\sin(\theta_2)$$

$$c(\mathbf{3})=\sin(\theta_1)\cos(\theta_2) \quad (19)$$

For a length N filter, the orthonormality conditions imply that:

$$\left[\sum_{n\,even} c(n)\right]^2 + \left[\sum_{n\,odd} c(n)\right]^2 = 1, \quad (20)$$

so that the c's may be reparameterized in terms of trigonometric functions given by:

$$\sum_{n=0}^{(N-1)/2} c(2n) = \cos\left(\sum_{n=0}^{(N-1)/2} \theta_n\right) \quad (21)$$

$$\sum_{n=0}^{(N-1)/2} c(2n+1) = \sin\left(\sum_{n=0}^{(N-1)/2} \theta_n\right).$$

As can be seen, the right-hand side contains (N−1)/2 terms, but the expansions of the left-hand sides using generalized trigonometric addition formula contains $2^{(N-1)/2}$ terms. Although the reparameterized form of the filter uses less terms, distributing the trigonometric monomials to the various filter coefficients is difficult and complex.

Distributing the trigonometric monomials to the various filter coefficients is accomplished using lattice factorization of filter banks. A polyphase matrix of any two channel orthogonal filter bank can be factorized as:

$$H_p^{(K)}=\rho(\theta_1)\Lambda(z)\rho(\theta_2)\ldots\Lambda(z)\rho(\theta_K) \quad (22)$$

where $\rho(\theta)\epsilon O(2)$ and $$\Lambda(z)=\begin{bmatrix}1 & 0\\ 0 & z^{-1}\end{bmatrix} \quad (23)$$

$$\rho(\theta)=\begin{bmatrix}\cos(\theta) & \sin(\theta)\\ -\sin(\theta) & \cos(\theta)\end{bmatrix}.$$

This procedure leads to a factorization of a wavelet transform. This factorization process is illustrated below for a filter having six (6) coefficients operating on a signal of length eight (8). Although illustrated for this example, the process can be extended for filters having a larger number of coefficients operating on signals having a longer length.

Equation (22) can be rewritten as:

$$H_p^{(K)}=H_p^{(K-1)}\Lambda(z)\rho(\theta_K). \quad (24)$$

As an illustrative example, a six coefficient filter using three angles will be provided. In particular, the polyphase matrices are given by:

$$H_p^1=H_p^{(k-2)}=\begin{bmatrix}c_0^{(1)} & c_1^{(1)}\\ d_0^{(1)} & d_1^{(1)}\end{bmatrix} \quad (25)$$

$$H_p^2=H_p^{(K-1)}=\begin{bmatrix}c_0^{(2)}+z^{-1}c_2^{(2)} & c_1^{(2)}+z^{-1}c_3^{(2)}\\ d_0^{(2)}+z^{-1}d_2^{(2)} & d_1^{(2)}+z^{-1}d_3^{(2)}\end{bmatrix}$$

$$H_p^3=H_p^K=\begin{bmatrix}c_0^{(3)}+z^{-1}c_2^{(3)}+z^{-2}c_4^{(3)} & c_1^{(3)}+z^{-1}c_3^{(3)}+z^{-2}c_5^{(3)}\\ d_0^{(3)}+z^{-1}d_2^{(3)}+z^{-2}d_4^{(3)} & d_1^{(3)}+z^{-1}d_3^{(3)}+z^{-2}d_5^{(3)}\end{bmatrix}$$

where the orthonormality is assured for $H_p^1$, and the remaining polyphase matrices derived from $H_p^1$ when $$H_p^1=\rho(\theta_1)=\begin{bmatrix}\cos(\theta_1) & \sin(\theta_1)\\ -\sin(\theta_1) & \cos(\theta_1)\end{bmatrix}. \quad (26)$$

Thus from equation (24), $H_p^2$ is given by:

$$H_p^2=H_p^1\Lambda(z)\rho(\theta_2), \quad (27)$$

which can be written as:

$$\begin{bmatrix}c_0^{(2)}+z^{-1}c_2^{(2)} & c_1^{(2)}+z^{-1}c_3^{(2)}\\ d_0^{(2)}+z^{-1}d_2^{(2)} & d_1^{(2)}+z^{-1}d_3^{(2)}\end{bmatrix}=\begin{bmatrix}\cos(\theta_1) & \sin(\theta_1)\\ -\sin(\theta_1) & \cos(\theta_1)\end{bmatrix}\begin{bmatrix}1 & 0\\ 0 & z^{-1}\end{bmatrix}\begin{bmatrix}\cos(\theta_2) & \sin(\theta_2)\\ -\sin(\theta_2) & \cos(\theta_2)\end{bmatrix} \quad (28)$$

Multiplying the right-hand side and solving for the value of the various coefficients on the left-hand side can be determined using the reparameterized coefficients directly by equating powers of z. This leads to:

$$c_0^{(2)}=\cos(\theta_1)\cos(\theta_2)=c_0^{(1)}\cos(\theta_2)$$

$$c_1^{(2)}=\cos(\theta_1)\sin(\theta_2)=c_0^{(1)}\sin(\theta_2) \quad (29)$$

$$c_2^{(2)}=-\sin(\theta_1)\sin(\theta_2)=-c_1^{(1)}\sin(\theta_2)$$

$$c_3^{(2)}=\sin(\theta_1)\cos(\theta_2)=c_1^{(1)}\cos(\theta_2)$$

and similarly for the d's:

$$d_0^{(2)}=-\sin(\theta_1)\cos(\theta_2)=d_0^{(1)}\cos(\theta_2)$$

$$d_1^{(2)}=-\sin(\theta_1)\sin(\theta_2)=d_0^{(1)}\sin(\theta_2) \quad (30)$$

$$d_2^{(2)}=-\cos(\theta_1)\sin(\theta_2)=-d_1^{(1)}\sin(\theta_2)$$

$$d_3^{(2)}=\cos(\theta_1)\cos(\theta_2)=d_1^{(1)}\cos(\theta_2)$$

These relationships can be re-written as $$\begin{bmatrix}c_3^{(2)}\\ c_2^{(2)}\\ c_1^{(2)}\\ c_0^{(2)}\end{bmatrix}=\begin{bmatrix}\cos(\theta_2) & 0\\ -\sin(\theta_2) & 0\\ 0 & \sin(\theta_2)\\ 0 & \cos(\theta_2)\end{bmatrix}\begin{bmatrix}c_1^{(1)}\\ c_0^{(1)}\end{bmatrix} \quad (31)$$

for the relationship in equation (29) and $$\begin{bmatrix}d_3^{(2)}\\ d_2^{(2)}\\ d_1^{(2)}\\ d_0^{(2)}\end{bmatrix}=\begin{bmatrix}\cos(\theta_2) & 0\\ -\sin(\theta_2) & 0\\ 0 & \sin(\theta_2)\\ 0 & \cos(\theta_2)\end{bmatrix}\begin{bmatrix}d_1^{(1)}\\ d_0^{(1)}\end{bmatrix} \quad (32)$$

for the relationships in equation (30). As noted above in equation (24), the next polyphase matrix $H_p^{(3)}$ can be found as a function of $H_p^{(2)}$. Multiplying the matrices and equating like powers of z as above yields:

$$\begin{bmatrix}c_5^{(3)}\\ c_4^{(3)}\\ c_3^{(3)}\\ c_2^{(3)}\\ c_1^{(3)}\\ c_0^{(3)}\end{bmatrix}=\begin{bmatrix}\cos(\theta_3) & 0 & 0 & 0\\ -\sin(\theta_3) & 0 & 0 & 0\\ 0 & \sin(\theta_3) & \cos(\theta_3) & 0\\ 0 & \cos(\theta_3) & -\sin(\theta_3) & 0\\ 0 & 0 & 0 & \sin(\theta_3)\\ 0 & 0 & 0 & \cos(\theta_3)\end{bmatrix}\begin{bmatrix}c_3^{(2)}\\ c_2^{(2)}\\ c_1^{(2)}\\ c_0^{(2)}\end{bmatrix}. \quad (33)$$

Substituting equation (31) into equation (33) yields $$\begin{bmatrix}c_5^{(3)}\\ c_4^{(3)}\\ c_3^{(3)}\\ c_2^{(3)}\\ c_1^{(3)}\\ c_0^{(3)}\end{bmatrix}=\begin{bmatrix}\cos(\theta_3) & 0 & 0 & 0\\ -\sin(\theta_3) & 0 & 0 & 0\\ 0 & \sin(\theta_3) & \cos(\theta_3) & 0\\ 0 & \cos(\theta_3) & -\sin(\theta_3) & 0\\ 0 & 0 & 0 & \sin(\theta_3)\\ 0 & 0 & 0 & \cos(\theta_3)\end{bmatrix}\begin{bmatrix}\cos(\theta_2) & 0\\ -\sin(\theta_2) & 0\\ 0 & \sin(\theta_2)\\ 0 & \cos(\theta_2)\end{bmatrix}\begin{bmatrix}\sin(\theta_1)\\ \cos(\theta_1)\end{bmatrix}. \quad (34)$$

If $B=A_3A_2A_1$ then the transpose of B, $B^T$ can be found to be $B^T=A_1^TA_2^TA_3^T$. Taking the transpose of equation (34) and combining equation (34) with a similar matrix equation for solving for the d's, yields:

$$\begin{bmatrix} c_5^{(3)} & c_4^{(3)} & c_3^{(3)} & c_2^{(3)} & c_1^{(3)} & c_0^{(3)} \\ d_5^{(3)} & d_4^{(3)} & d_3^{(3)} & d_2^{(3)} & d_1^{(3)} & d_0^{(3)} \end{bmatrix} = \begin{bmatrix} \sin(\theta_1) & \cos(\theta_1) \\ \cos(\theta_1) & -\sin(\theta_1) \end{bmatrix} \begin{bmatrix} \cos(\theta_2) & -\sin(\theta_2) & 0 & 0 \\ 0 & 0 & \sin(\theta_2) & \cos(\theta_2) \end{bmatrix} * \begin{bmatrix} \cos(\theta_3) & -\sin(\theta_3) & 0 & 0 & 0 & 0 \\ 0 & 0 & \sin(\theta_3) & \cos(\theta_3) & 0 & 0 \\ 0 & 0 & \cos(\theta_3) & -\sin(\theta_3) & 0 & 0 \\ 0 & 0 & 0 & 0 & \sin(\theta_3) & \cos(\theta_3) \end{bmatrix} \quad (35)$$

Thus, each coefficient can be found as a function of the reparameterized angle coefficients. Performing the matrix multiplication in equation (35) defines each coefficient as a linear combination of two or more trigonometric functions. Reformulating equation (4) from above such that the c's and d's alternate rows, the matrix $C_1$ can be written as the product of three matrices:

$$\begin{bmatrix} c_5 & c_4 & c_3 & c_2 & c_1 & c_0 & 0 & 0 \\ d_5 & d_4 & d_3 & d_2 & d_1 & d_0 & 0 & 0 \\ 0 & 0 & c_5 & c_4 & c_3 & c_2 & c_1 & c_0 \\ 0 & 0 & d_5 & d_4 & d_3 & d_2 & d_1 & d_0 \\ c_5 & c_4 & 0 & 0 & c_3 & c_2 & c_1 & c_0 \\ d_5 & d_4 & 0 & 0 & d_3 & d_2 & d_1 & d_0 \\ c_5 & c_4 & c_3 & c_2 & 0 & 0 & c_1 & c_0 \\ d_5 & d_4 & d_3 & d_2 & 0 & 0 & d_1 & d_0 \end{bmatrix} = \begin{bmatrix} S_1 & K_1 & 0 & 0 & 0 & 0 & 0 & 0 \\ K_1 & -S_1 & 0 & 0 & 0 & 0 & 0 & 0 \\ 0 & 0 & S_1 & K_1 & 0 & 0 & 0 & 0 \\ 0 & 0 & K_1 & -S_1 & 0 & 0 & 0 & 0 \\ 0 & 0 & 0 & 0 & S_1 & K_1 & 0 & 0 \\ 0 & 0 & 0 & 0 & K_1 & -S_1 & 0 & 0 \\ 0 & 0 & 0 & 0 & 0 & 0 & S_1 & K_1 \\ 0 & 0 & 0 & 0 & 0 & 0 & K_1 & -S_1 \end{bmatrix} * \quad (36)$$

$$\begin{bmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \end{bmatrix} * \begin{bmatrix} S_2 & K_2 & 0 & 0 & 0 & 0 & 0 & 0 \\ K_2 & -S_2 & 0 & 0 & 0 & 0 & 0 & 0 \\ 0 & 0 & S_2 & K_2 & 0 & 0 & 0 & 0 \\ 0 & 0 & K_2 & -S_2 & 0 & 0 & 0 & 0 \\ 0 & 0 & 0 & 0 & S_2 & K_2 & 0 & 0 \\ 0 & 0 & 0 & 0 & K_2 & -S_2 & 0 & 0 \\ 0 & 0 & 0 & 0 & 0 & 0 & S_2 & K_2 \\ 0 & 0 & 0 & 0 & 0 & 0 & K_2 & -S_2 \end{bmatrix} *$$

$$\begin{bmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \end{bmatrix} * \begin{bmatrix} S_3 & K_3 & 0 & 0 & 0 & 0 & 0 & 0 \\ K_3 & -S_3 & 0 & 0 & 0 & 0 & 0 & 0 \\ 0 & 0 & S_3 & K_3 & 0 & 0 & 0 & 0 \\ 0 & 0 & K_3 & -S_3 & 0 & 0 & 0 & 0 \\ 0 & 0 & 0 & 0 & S_3 & K_3 & 0 & 0 \\ 0 & 0 & 0 & 0 & K_3 & -S_3 & 0 & 0 \\ 0 & 0 & 0 & 0 & 0 & 0 & S_3 & K_3 \\ 0 & 0 & 0 & 0 & 0 & 0 & K_3 & -S_3 \end{bmatrix}$$

Where $S_k=\sin(\theta_k)$, $K_k=\cos(\theta_k)$ and all coefficients are assumed to be for the third polyphase matrix so that the superscripts have been dropped without any loss of generality. The matrix equation given in equation (36) can be expressed in the form of:

$$C_1=R(\theta_1)SR(\theta_2)SR(\theta_3) \quad (37)$$

where R(θ) are wavelet transform matrices and S are shifting matrices. A matrix E is then applied to $C_1$ to separate the high-pass coefficients from the low-pass ones.

The above is for illustrative purposes only, and signals with lengths of 16, 32, 64, or greater powers of two may be filtered. As an example, the left-hand side of equation (36) can be extended to filter a signal of length thirty-two (32). In this example, the left-hand side of equation (36), which is $C_1$ in equation (11), becomes a 32×32 matrix in which the coefficients are shifted and wrapped around across all thirty-two columns. $C_2$ is formed in a block matrix form as follows:

$$C_2 = \begin{bmatrix} C_{1(16\times16)} & 0_{16\times16} \\ 0_{16\times16} & I_{16\times16} \end{bmatrix} \quad (38)$$

where $C_1$ is the left-hand side 8×8 matrix of equation (36) extended to a 16×16 matrix by shifting and wrapping the filter coefficients as described above. In the illustrative example, Qmax is given by equation (1) and is equal to 3. $C_3$ is then given in block matrix form as:

$$C_3 = \begin{bmatrix} C_{1(8\times8)} & 0_{8\times8} & 0_{16\times16} \\ 0_{8\times8} & I_{8\times8} & \\ 0_{16\times16} & & I_{16\times16} \end{bmatrix} \quad (39)$$

where $C_1$ is the left-hand side 8×8 matrix in equation (36). Thus, a wavelet transform of data of length 32 can be given by:

$$C = C_3C_2C_1 = \begin{bmatrix} C_{1(8\times 8)} & 0_{8\times 8} & 0_{16\times 16} \\ 0_{8\times 8} & I_{8\times 8} & \\ 0_{16\times 16} & & I_{16\times 16} \end{bmatrix} \begin{bmatrix} C_{1(16\times 16)} & 0_{16\times 16} \\ 0_{16\times 16} & I_{16\times 16} \end{bmatrix} [C_{1(32\times 32)}], \tag{40}$$

This can also be expressed as:

$$C=E_QR_Q(\theta_1)S_QR_Q(\theta_2)\ldots S_QR_Q(\theta_K)\ldots E_1R_1(\theta_1)S_1R_1(\theta_2)\ldots S_1R_1(\theta_K). \tag{41}$$

As can be observed, the filter is a traditional straight wavelet transform. As is known, the straight wavelet transform continuously applies a low and a high pass filter to the data, down-samples the results by two (2), retaining the high pass results, then applies the high and low pass filters to the low pass results only. This is repeated until the filter size is too small to filter the remaining data. Alternatively, a subset of wavelet transforms that are less than the maximum number of transforms calculated in equation (1) may also be used to form the basis.

Figure 2:
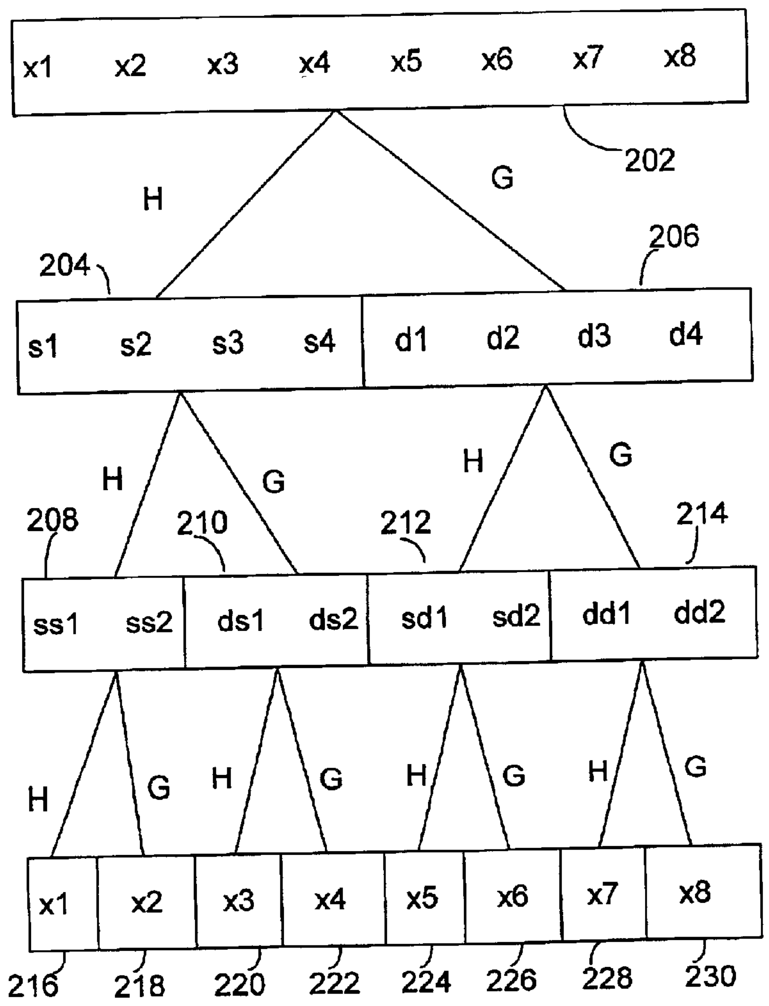
FIG. 2 is a diagram depicting a wavelet packet library of orthonormal wavelet packets.

Other wavelet bases may be used, however, and the possible combinations of the placement of the identity matrix and C, matrix within each sub-block can be used. FIG. 2 provides a wavelet packet tree corresponding to a wavelet transform of input data 202 having a length of eight (8). As discussed below, each subspace of the original signal space is filtered using the same predetermined high and low pass filters. The form of the predetermined high and low pass filters is selected depending upon the particular wavelet that is being used. The input data 202 is filtered by high and low pass filters, G and H respectively, into a first subspace having first and second orthonormal bases 204 and 206 respectively each having a length of four (4). The first and second orthonormal bases 204 and 206 are filtered by high and low pass filters, G and H respectively, forming a second subspace having four orthonormal bases 208, 210, 212, and 214 each having a length of two (2). Each of the four orthonormal bases 208–214 are filtered by a high and low pass filter, G and H respectively, forming a third subspace having eight (8) orthonormal bases 216, 218, 220, 222, 224, 226, 228, and 230 each having a length of one (1). Each possible combination of non-overlapping subspaces of the original signal space forms a unique basis entry in the wavelet packet basis library, and in addition, each of the possible combinations is also an orthonormal basis. It is possible to identify the optimal orthonormal basis within the wavelet packet basis library that will provide for an optimal wavelet basis for representing that particular signal.

A particularly efficient method of selecting the best basis is an entropy-based selection process. In this method, the entropy of a family of wavelet packet bases operating on a signal vector is calculated and the best basis is selected as the basis providing the minimum entropy. A suitable entropy function can be developed in which the sequences of data operated on by each basis in the wavelet packet library is compared by their respective rate of decay, i.e., the rate at which the elements within the sequence becomes negligible when arranged in decreasing order. This allows the dimension of the signal to be computed as:

$$d = \exp\left(-\sum_n p_n \log_2 p_n\right) \tag{42}$$

where $p_n=|x_n|^2\|x\|^2$ and $$-\sum_n p_n \log_2 p_n$$

represents the entropy, or information cost, of the processed signal. This leads to a proposition in which if two sequences $\{x_n\}$ and $\{x_n'\}$ are compared so that a function corresponding function $\{p_n\}$ and $\{p_n'\}$ are monotonically decreasing and if $\Sigma_{0<n<m}p_n \geqq \Sigma_{0<n<m}p'_n$ then $d \leqq d'$. Although entropy is one measure of concentration or efficiency of an expression, other cost functions are also possible depending upon the application and the need to discriminate and choose between special functions.

The wavelet packet basis selected, which may or may not be the optimal basis for the particular signal, is applied to the sequence of data forming a transformed sequence of data. The particular parameters are optimized to select the optimal set of parameters and hence, the optimal set of filter coefficients. In the preferred embodiment, a gradient descent can be used to optimize the parameters. In particular, the gradient of the objective function with respect to the parameter set can be calculated as:

$$\nabla_\theta \phi = J_\theta^T \nabla_y \phi \tag{43}$$

where J is the Jacobian matrix for Cx, $\phi$ is the objective function, $\theta$ is the set of parameters, and y is the input data sequence transformed by the selected basis. The Jacobian matrix is of the form:

$$J_\theta=[(\partial_{\theta 1}C)\vec{x}(\partial_{\theta 2}C)\vec{x}, \ldots, (\partial_{\theta k}C)\vec{x}]. \tag{44}$$

An explicit form of the derivatives with respect to the new parameters can be obtained using equation (41):

$$\begin{aligned} \partial_j C(\theta_1 \ldots, \theta_K) = {} & (\partial_j C_Q)C_{Q-1}\ldots C_1 + C_Q(\partial, C_{Q-1})\ldots C_1 + \ldots C_QC_{Q-1}\ldots(\partial_j C_1) = \\ & ER_Q(\theta_1)S_Q \ldots \partial_j R_Q(\theta_j)\ldots S_1R_1(\theta_K) + ER_Q(\theta_1)S_Q \ldots \partial_j R_{Q-1}(\theta_j) \\ & \ldots S_1R_1(\theta_K) + \ldots ER_Q(\theta_1)S_Q \ldots \partial_j R_j(\theta_j)\ldots S_1R_1(\theta_K) = \\ & ER_Q(\theta_1)S_Q \ldots R_Q\left(\theta_j + \frac{\pi}{2}\right)\ldots S_1R_1(\theta_K) + \\ & ER_Q(\theta_1)S_Q \ldots R_{Q-1}\left(\theta_j + \frac{\pi}{2}\right)\ldots S_1R_1(\theta_K) + \\ & ER_Q(\theta_1)S_Q \ldots R_Q\left(\theta_j + \frac{\pi}{2}\right)\ldots S_1R_1(\theta_K) \end{aligned} \tag{45}$$

where $$\partial_j = \frac{\partial}{\partial\theta_j},$$

j=1, 2, . . . , K and $\sin'(\theta)=\cos(\theta)=\sin(\theta+\pi/2)$, and $\cos'(\theta)=\sin(\theta)=\cos(\theta+\pi/2)$. It is possible to express the above derivatives in terms of rotations of the original angles, thus making the storage and computation of the derivatives more efficient. The derivative of a rotation block is:

$$\bar{p}'(\theta) = \bar{p}\left(\theta + \frac{\pi}{2}\right) = \begin{bmatrix} 0 & 1 \\ -1 & 0 \end{bmatrix} \bar{p}(\theta) \tag{46}$$

so that $$\partial_j R_l(\theta_j) = D_l R_l(\theta_j) \tag{47}$$

where $D_1$ is a block diagonal matrix. Thus, equation (45) becomes:

$$\partial_j C(\theta_1, \ldots \theta_K) = ER_Q(\theta_1)S_Q \ldots D_Q R_Q(\theta_j) \ldots S_1 R_1(\theta_K) +$$

$$ER_Q(\theta_1)S_Q \ldots D_{Q-1}R_{Q-1}(\theta_j) \ldots S_1 R_1(\theta_K) + (48) +$$

$$ER_Q(\theta_1)S_Q \ldots D_1 R_1(\theta_j) \ldots S_1 R_1(\theta_K) \tag{48}$$

Accordingly, with the appropriate choice of the matrices $C_1$, $C_2, \ldots, C_Q$ the above expression allows for the computation of the gradient with respect to the angles for any basis in the wavelet packet library.

Thus, the Jacobian can be computed and stored efficiently and separately from the objective function gradient that is calculated. Accordingly, the Jacobian is efficiently computed for each set of parameters that are used in the gradient descent method. For each of the sets of variables that are used, the Jacobian can be calculated and stored according to equation (48).

The gradient of the objective function $\phi$ is calculated with respect to the transformed data sequence, i.e., the resultant data sequence from applying the selected wavelet basis to the input data sequence. This result is multiplied by the Jacobian matrix and the product of the Jacobian matrix and the gradient vector forms the gradient vector of the objective function with respect to the angle parameters. The gradient vector of the objective function with respect to the angle parameters provides a vector that is the steepest descent from the starting point to a local minimum. If the gradient vector is equal to zero, or less than a gradient threshold level, a local minimum has been reached, or nearly reached, and the objective function is calculated for the current angle parameters. If the objective function is less than a predetermined objective function criterium, the current angle parameters are the optimal angle parameters and the filter coefficients can be calculated as described above. If the gradient vector of the objective function with respect to the angle parameters does not indicate that it is at or near a local minimum, or if the objective function exceeds the predetermined objective function threshold, then a predetermined adjustment is made to the current set of angle parameters. This process is repeated until an optimal set of angle parameters is found. The actual value of the gradient threshold level, the predetermined objective function threshold, and the predetermined adjustment to the angle parameters are dependent on the particular system requirements.

Figure 3:
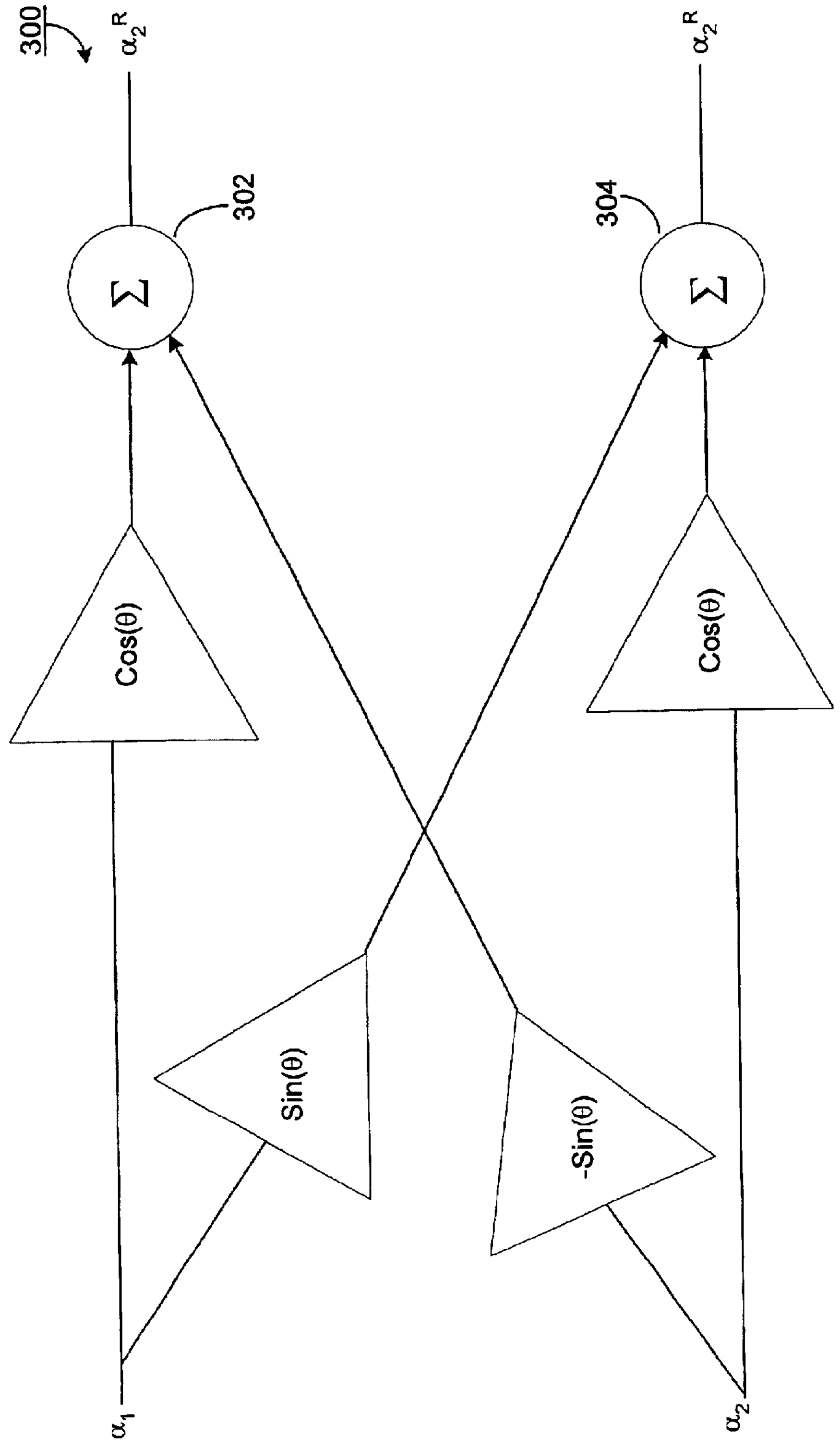
FIG. 3 is a block diagram depicting a Given's rotation block.

FIG. 3 depicts a block diagram of a rotation block suitable for rotating a pair of input signals according to the rotation:

$$\begin{bmatrix} \alpha_1^R \\ \alpha_2^R \end{bmatrix} = \begin{bmatrix} K_\theta & -S_\theta \\ S_\theta & K_\theta \end{bmatrix} \begin{bmatrix} \alpha_1 \\ \alpha_2 \end{bmatrix}, \tag{49}$$

where $K_\theta = \cos(\theta)$ and $S_\theta = \sin(\theta)$. The rotation block depicted in FIG. is considered to have a rotation angle of $\theta$ such that the input signals will be rotated through an angle of $\theta$. The rotation block 300 includes first and second inputs $\alpha_1$ and $\alpha_2$. Input $\alpha_1$ is multiplied by the $\cos(\theta_1)$ and $\sin(\theta_1)$, and input $\alpha_2$ is multiplied by the $\cos(\theta_1)$ and $-\sin(\theta_1)$. The products $\alpha_1\cos(\theta_1)$ and $-\alpha_2\sin(\theta_1)$ are added together in summation module 302 to provide output $-\alpha_1^R$. Similarly, the products $\alpha_2\cos(\theta_1)$ and $\alpha_1\sin(\theta_1)$ are added together in summation module 304 to provide output $\alpha_2^R$. The rotation block depicted in FIG. 3, in combination with delay modules and down-sample modules, forms the basic building block of the lattice filters. When used in a wavelet system, these lattice filters can form the high and low pass filters that are used to determine the wavelet transform of the input data.

Figure 4:
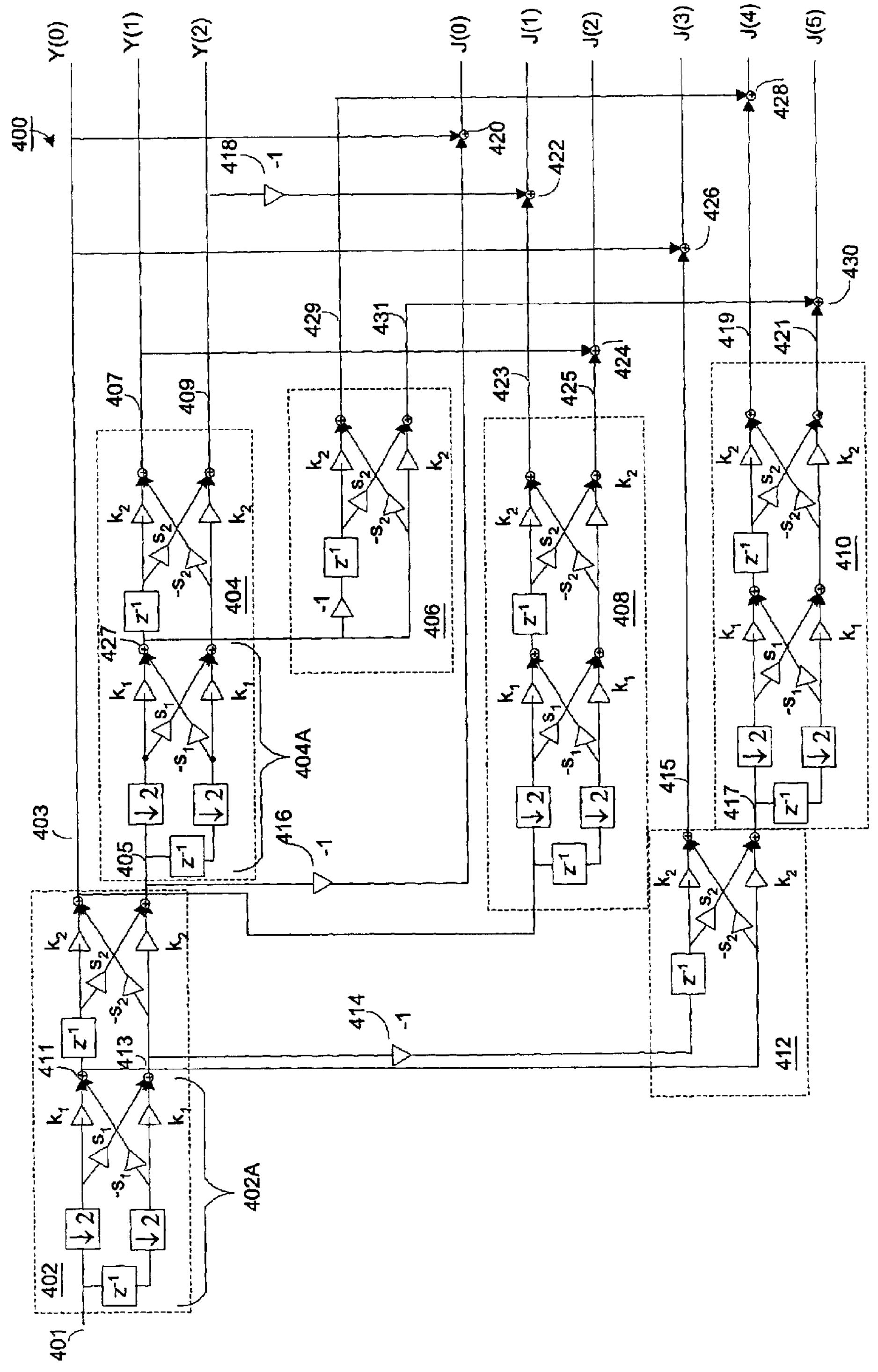
FIG. 4 is a block diagram depicting a cascade of lattice filters suitable for use with the method depicted in FIG. 1

FIG. 4 depicts one form of a cascade lattice filter that is suitable for use with a filter of length four (4) using two decomposition steps. The architecture and layout of the various sub-systems is based on the straight wavelet transform. In this formulation the length of the signal can be arbitrary since the values of the signal are continuously modified from left to right.

FIG. 4 is a circuit equivalent of steps 111–118 of the flow chart depicted in FIG. 1. The lattice filter depicted in FIG. 4 is of length four (4) for illustrative purposes only. The filter bank depicted therein can be modified to include more parameters, i.e., angles, more decomposition steps, i.e., larger Q, and different bases from the wavelet packet table by adjusting the overall architecture in accordance with the system requirements. In addition, as the angles are updated during the optimization process described with respect to FIG. 1, the corresponding rotation angles in the various lattice filters will be updated accordingly.

In particular, FIG. 4 depicts a wavelet transform/Jacobian module 400 that receives a sequence of data on line 401 and filters the received data with filter module 402. Filter module 402 is a two stage lattice filter that includes two rotation modules as depicted in FIG. 3 that have rotation angles equal to $\theta_1$ and $\theta_2$ respectively. Filter module 402 provides a first high pass data output and a first low pass data output, 403 and 405 respectively, that represent the high pass and low pass filtered input data respectively. The low pass data output 405 is subsequently filtered by filter module 404 that includes two rotation blocks that have rotation angles of $\theta_1$ and $\theta_2$ respectively. The filter module 404 provides a second high pass data output and a second low pass data output 407 and 409 respectively. The first high pass data output 403 and the second high pass data output 407 and the second low pass data output 409 together form the transformed data output values y(0), y(1), and y(2) respectively.

The Jacobian can also be computed simultaneously with the transformed data vector y(0), y(1), and y(2). In particular, the data on line 413 is negated by module 414 and provided as a first input to provided module 412. The data on line 411 is provided as the second input to module 412. Module 412 in combination with the portion 402A of filter module 402 form a lattice filter module having first and second rotation blocks having rotation angles of $\theta_1$ and $\theta_2$ respectively. Module 412 provides a first data output 415 and a second data output 417, wherein the second data output 417 is subsequently filtered by lattice filter module 410 that provides a third and fourth data output 419 and 421.

The high pass filter data output 403 is provided to lattice filter module 408 that has two rotation modules that have rotation angles of $\theta_1$ and $\theta_2$ respectively. Filter module 408 filters the high pass data output 403 and provides a fifth data output 423 and a sixth data output 425. The data on line 427 is provided to module 406, which in combination with the first portion 404A of lattice filter module 404 also forms a lattice filter having two rotation blocks that have rotation angles of $\theta_1$ and $\theta_2$ respectively. Module 406 provides a seventh data output 429 and an eighth data output 431.

The Jacobian values are formed as linear combinations of the various output data. In particular, J(0) is formed as the sum of the low pass data filter output 405 that is negated by module 416 age and the transformed output Y(0) combined in summation module 420. J(1) is formed as the sum of the fifth data output line 423 and the transformed output value Y(2), negated by module 418, combined in the summation module 422. J(2) is formed as the sum of the sixth data output line 425 and the transformed output value Y(1) combined in the summation module 424. J(3) is formed as the sum of the first data output line 415 and the transformed output value Y(0) combined in the summation module 426. J(4) is formed as the sum of the third data output line 419 and the seventh data output on line 429 combined in the summation module 428. J(5) is formed as the sum of the fourth data output line 421 and the eighth output data line 431 combined in the summation module 430. the data that is provided on the outputs J(0), J(1), . . . ,J(5) corresponds to the type of decomposition matrix that is used. For example, in the straight wavelet transform depicted in equations (38)–(40) the various Y output values correspond to the various blocks of the block diagonal matrix. In this example using 64 data input signals, J(0) provides 32 values, J(1) provides 16 values, J(2) provides 8 values, J(3) provides 4 values, J(4) provides 2 values, and J(1) provides 1 value. As can be seen, the values provided by each output corresponds to the position of the identity matrix in the straight wavelet transform block matrices.

It is convenient to require that the mean of the high pass filter used herein be zero to ensure that no DC component passes through the filter without significant attenuation. In the time domain formulation a zero mean high pass filter satisfies the zero mean filter criteria:

$$\sum_{n=0}^{N}(-1)^n c(N-n)=0. \tag{50}$$

where c is the coefficient of the high pass filter as discussed above. This condition when translated into the lattice angle formulation and combined with the inequalities in equation (21) becomes:

$$\sum_{n=0}^{N}(-1)^n c(N-n)= \sum_{n=0}^{\frac{(N-1)}{2}} c(2n)-\sum_{n=0}^{\frac{(N-1)}{2}} c(2n+1)=\cos\left(\sum_{j=1}^{k}\theta_j\right)-\sin\left(\sum_{j=1}^{k}\theta_j\right)=0. \tag{51}$$

The above is true if:

$$\sum_{j=1}^{k}\theta_j=\frac{\pi}{4}. \tag{52}$$

where k is equal to N/2, and N is the number of time domain filter coefficients. Thus, the search for the optimal filter coefficients becomes a constrained optimization problem that is expressed as:

$$\vec{\theta}_{\min}=\underset{\sum_{j=1}^{k}\theta_j=\pi/4}{\arg\min}\ \phi(\theta_1,\ldots,\theta_k) \tag{57}$$

The gradient of objective function can easily be expressed on this plane, where the objective function is given by:

$$\Phi(\theta_1,\ldots,\theta_{k-1})=\phi\left(\theta_1,\ldots,\frac{\pi}{4}-\sum_{j=1}^{k-1}\theta_j\right) \tag{58}$$

then the gradient of the objective function provided in equation (58) is given by:

$$\nabla\Phi(\theta_1,\ldots,\theta_{k-1})=\begin{bmatrix}1 & \cdots & 0 & -1\\ \vdots & \ddots & \vdots & \vdots\\ 0 & \cdots & 1 & -1\end{bmatrix}\nabla\phi\left(\theta_1,\ldots,\frac{\pi}{4}-\sum_{j=1}^{k-1}\theta_j\right) \tag{59}$$

As can be seen, constraining the high pass filter to be a zero mean filter has the advantage of reducing the complexity of the optimization problem by one from k to k−1 degrees of freedom.

Those of ordinary skill in the art should further appreciate that variations to and modification of the above-described methods for providing optimal filter coefficients may be made without departing from the inventive concepts disclosed herein. Accordingly, the invention should be viewed as limited solely by the scope spirit of the appended claims.

What is claimed is:

1. A method for determining filter coefficients to form a filter to filter data of length N, wherein the filter coefficients are optimized to minimize an objective function that measures a predetermined quality of the signal data, the method comprising the steps of:

providing a number of coefficients, K, in the filter;

selecting a wavelet packet basis;

providing an objective function;

providing a first set of k/2 parameter values;

forming a data transform matrix as a function of wavelet packet basis and the k/2 parameter values;

calculating transformed data by multiplying the data transform matrix with the signal data;

calculating the value of the objective function based on the transformed data; and finding the optimal set of values for the k/2 parameters.

2. The method of claim 1 wherein the step of finding the optimal set of values for the k/2 parameters includes:

determining if the value of the objective function satisfies a first criteria;

in the event that the value of the objective function satisfies the first criteria, setting the optimal set of the values of the k/2 parameters equal to the current value of the first set of k/2 parameters;

in the event that the value of the objective function does not satisfy the first criteria, calculating the Jacobian of the data transform matrix based on the data and the current values of the k/2 parameters;

calculating the gradient of the calculated objective function with respect to the transformed input data;

multiplying the Jacobian with the gradient of the calculated objective function with respect to the transformed input data to form the gradient of the parameters;

determining if the gradient of the parameters satisfies a second threshold value;

in the event that the gradient of the parameters satisfies the second criteria, calculating the optimal filter coefficients based on the current values of the k/2 parameters;

in the event that gradient does not satisfy the second threshold value, forming a new set of k/2 parameter values by updating the value of the current value of the k/2 parameters delta value;

returning to the forming a data transform matrix step and re-execute the intervening steps.

3. The method of claim 2 wherein the form of the Jacobian matrix of the data transform matrix is of the form $ER_Q(\theta_1)S_Q \ldots \partial_j R_Q(\theta_j) \ldots S_1R_1(\theta_K)+ER_Q(\theta_1)S_Q \ldots \partial_j R_{Q-1}(\theta_j) \ldots S_1R_1(\theta_k)+\ldots ER_Q(\theta_1)S_Q \ldots \partial_j R_j(\theta_j) \ldots S_1R_1(\theta_K)$.

4. The method of claim 3 wherein the form of the Jacobian matrix of the data transform matrix is of the form $$ER_Q(\theta_1)S_Q \ldots R_Q\left(\theta_j + \frac{\pi}{2}\right) \ldots S_1R_1(\theta_K) + ER_Q(\theta_1)S_Q \ldots R_{Q-1}\left(\theta_j + \frac{\pi}{2}\right) \ldots S_1R_1(\theta_K) + ER_Q(\theta_1)S_Q \ldots R_Q\left(\theta_j + \frac{\pi}{2}\right) \ldots S_1R_1(\theta_K).$$

5. The method of claim 4 wherein the Jacobian matrix of the data transform matrix is of the form $ER_Q(\theta_1)S_Q \ldots D_QR_Q(\theta_j) \ldots S_1R_1(\theta_1)+ER_Q(\theta_1)S_Q \ldots D_{Q-1}R_{Q-1}(\theta_j) \ldots S_1R_1(\theta_1)+ER_Q(\theta_1)S_Q \ldots D_1R_1(\theta_j) \ldots S_1R_1(\theta_k)$.

6. The method of claim 1 wherein the step of selecting a wavelet packet basis includes selecting an optimal wavelet basis.

7. The method of claim 6 wherein the optimal wavelet basis is an orthonormal basis.

8. The method of claim 7 wherein the optimal orthonormal basis is selected from a wavelet packet library.

9. The method of claim 8 wherein the optimal orthonormal basis selected from a wavelet packet library is selected to minimize a predetermined cost function.

10. The method of claim 9 wherein the cost function is an entropy function of the wavelet packet basis applied to the input data sequence.

11. The method of claim 10 wherein the entropy function is equal to $$-\sum_n p_n \log_2 p_n.$$

12. The method of claim 1 wherein the step of providing a first set of k/2 parameters includes providing k/2 lattice filter angles.

13. The method of claim 12 wherein the reparameterized basis is a function of at least one trigonometric function.

14. The method of claim 1 wherein the data transform matrix is of the form $C=E_QR_Q(\theta_1)S_QR_Q(\theta_2) \ldots S_QR_Q(\theta_1) \ldots E_1R_1(\theta_1)S_1R_1(\theta_2) \ldots S_1R_1(\theta_1)$ with $$Q \le \left[\log_2\left(\frac{M+1}{N+1}\right)\right].$$

15. The method of claim 1 wherein step (d) providing a first set of k/2 parameter values includes providing random values for the first set of k/2 parameters.

16. The method of claim 1 wherein the step of providing a first set of k/2 parameter values includes using a priori information.

17. The method of claim 1 wherein the step of providing a first set of k/2 parameter values includes the steps of:

selecting a mother wavelet;

selecting a set of K coefficients corresponding to the mother wavelet; and computing the k/2 parameters that correspond to the mother wavelet in a lattice decomposition.

18. The method of claim 1 wherein the step of providing a first set of k/2 parameter values includes the steps of:

selecting a mother wavelet;

selecting a set of K coefficients corresponding to the mother wavelet; and providing k/2 predetermined parameters that correspond to the mother wavelet in a lattice decomposition.

19. The method of claim 1 wherein the step of providing a first set of k/2 parameter values includes providing the first set of k/2 parameter values that satisfy a zero mean filter criteria.

20. The method of claim 19 wherein the zero mean filter criteria is $$\sum_{j=1}^{k} \theta_j = \frac{\pi}{4}.$$

21. The method of claim 20 wherein the step of finding the optimal set of values for the k/2 parameters includes:

defining the objective function as:

$$\Phi(\theta_1, \ldots, \theta_{k-1}) = \phi\left(\theta_1, \ldots, \frac{\pi}{4} - \sum_{j=1}^{k-1} \theta_j\right);$$

providing the gradient of the objective function with respect to the k/2 parameters as:

$$\nabla\Phi(\theta_1, \ldots, \theta_{k-1}) = \begin{bmatrix} 1 & \cdots & 0 & -1 \\ \vdots & \ddots & \vdots & \vdots \\ 0 & \cdots & 1 & -1 \end{bmatrix} \nabla\phi\left(\theta_1, \ldots, \frac{\pi}{4} - \sum_{j=1}^{k-1} \theta_j\right);$$

setting the gradient to a threshold value; and solving the gradient for a set of k/2 parameters that satisfy the gradient equation.

* * * * *

UNITED STATES PATENT AND TRADEMARK OFFICE

CERTIFICATE OF CORRECTION

PATENT NO. : 6,961,742 B2
APPLICATION NO. : 10/076059
DATED : November 1, 2005
INVENTOR(S) : Nicola Neretti et al.

It is certified that error appears in the above-identified patent and that said Letters Patent is hereby corrected as shown below:

Column 11, line 30, "C," should read --$C_1$--;

Column 13, line 15, delete "(48) +";

Column 13, line 65, "FIG. is" should read --FIG. 3 is--;

Column 14, line 4, "$-\alpha_1^R$" should read --$\alpha_1^R$--; and

Column 15, line 4, delete the word "age".

Signed and Sealed this

Fifteenth Day of August, 2006

JON W. DUDAS
*Director of the United States Patent and Trademark Office*